(12) United States Patent
Kwong (10) Patent No.: US 6,552,583 B1
(45) Date of Patent: Apr. 22, 2003

(54) ESD-PROTECTION DEVICE WITH ACTIVE R-C COUPLING TO GATE OF LARGE OUTPUT TRANSISTOR

(75) Inventor: David Kwong, Fremont, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 34 days.

(21) Appl. No.: 09/682,734

(22) Filed: Oct. 11, 2001

(51) Int. Cl.[7] ................................................. H02H 9/04
(52) U.S. Cl. ....................... 327/112; 327/581; 361/111
(58) Field of Search ................................ 327/112, 437, 327/576, 581, 310, 313, 318, 321, 328; 361/111

(56) References Cited

U.S. PATENT DOCUMENTS

| | | | |
|---|---|---|---|
| 4,678,950 A | 7/1987 | Mitake | 327/321 |
| 4,855,620 A | 8/1989 | Duvvury et al. | 326/119 |
| 5,208,719 A | 5/1993 | Wei | 361/56 |
| 5,287,241 A | 2/1994 | Puar | 361/56 |
| 5,442,217 A | 8/1995 | Mimoto | 257/361 |
| 5,537,067 A * | 7/1996 | Carvajal et al. | 327/112 |
| 5,631,793 A | 5/1997 | Ker et al. | 361/56 |
| 5,686,751 A | 11/1997 | Wu | 257/356 |
| 5,710,682 A | 1/1998 | Arya et al. | 360/245.8 |
| 5,729,419 A * | 3/1998 | Lien | 361/111 |
| 5,959,488 A | 9/1999 | Lin et al. | 327/313 |
| 5,982,217 A | 11/1999 | Chen et al. | 327/321 |
| 5,986,867 A * | 11/1999 | Duvvury et al. | 361/111 |
| 5,990,723 A | 11/1999 | Tanase | 327/313 |
| 6,064,556 A | 5/2000 | Ravanelli | 361/111 |
| 6,118,323 A | 9/2000 | Chaine et al. | 327/333 |
| 6,118,640 A | 9/2000 | Kwong | 361/56 |
| 6,249,410 B1 * | 6/2001 | Ker et al. | 361/111 |

* cited by examiner

Primary Examiner—Timothy P. Callahan
Assistant Examiner—Terry L. Englund
(74) Attorney, Agent, or Firm—Stuart T. Auvinen (57) ABSTRACT

Large output driver transistors are used to shunt electrostatic-discharge (ESD) pulses. ESD pulses are capacitivly coupled to the gates of the large driver transistors by R-C networks. The capacitive coupling causes a gate-to-source voltage to exceed the transistor threshold, turning on the large driver transistor to shunt the ESD current. Transistor switches are inserted into the R-C networks. These transistor switches disconnect the R-C networks during normal operation, and ensure that the R-C networks couple the I/O pad to the gates of the output driver transistors only when power is turned off. Since ESD events normally occur when power is disconnected, such as during handling by a person or machine, the ESD protection is only needed when power is off. Thus an active ESD-protection device can be disabled during normal powered operation of the IC. A feedback circuit detects power and biases the gates of the transistor switches.

20 Claims, 5 Drawing Sheets

PRIOR ART

ESD-PROTECTION DEVICE WITH ACTIVE R-C COUPLING TO GATE OF LARGE OUTPUT TRANSISTOR

BACKGROUND OF INVENTION

This invention relates to integrated circuits, and more particularly to input-protection and electro-static-discharges (ESD) protection circuits.

Higher-density integrated circuits (IC's) are made possible by advances in semiconductor manufacturing, especially by reducing transistor size. However, smaller transistors are more sensitive to damage from external shocks, such as electro-static-discharges (ESD). Thinner gate oxides can be shorted, and substrate junctions melted by relatively small currents applied to the tiny devices. Static charges from a person or machinery can produce such damaging currents.

The input/output (I/O) pads of a semiconductor chip almost always have special protection circuits designed to block such ESD currents from reaching and damaging interior transistors. A wide variety of ESD-protection circuits and devices are in use today. Yet the design of such ESD-protection circuits remains as much of an art as a science.

Figure 1:
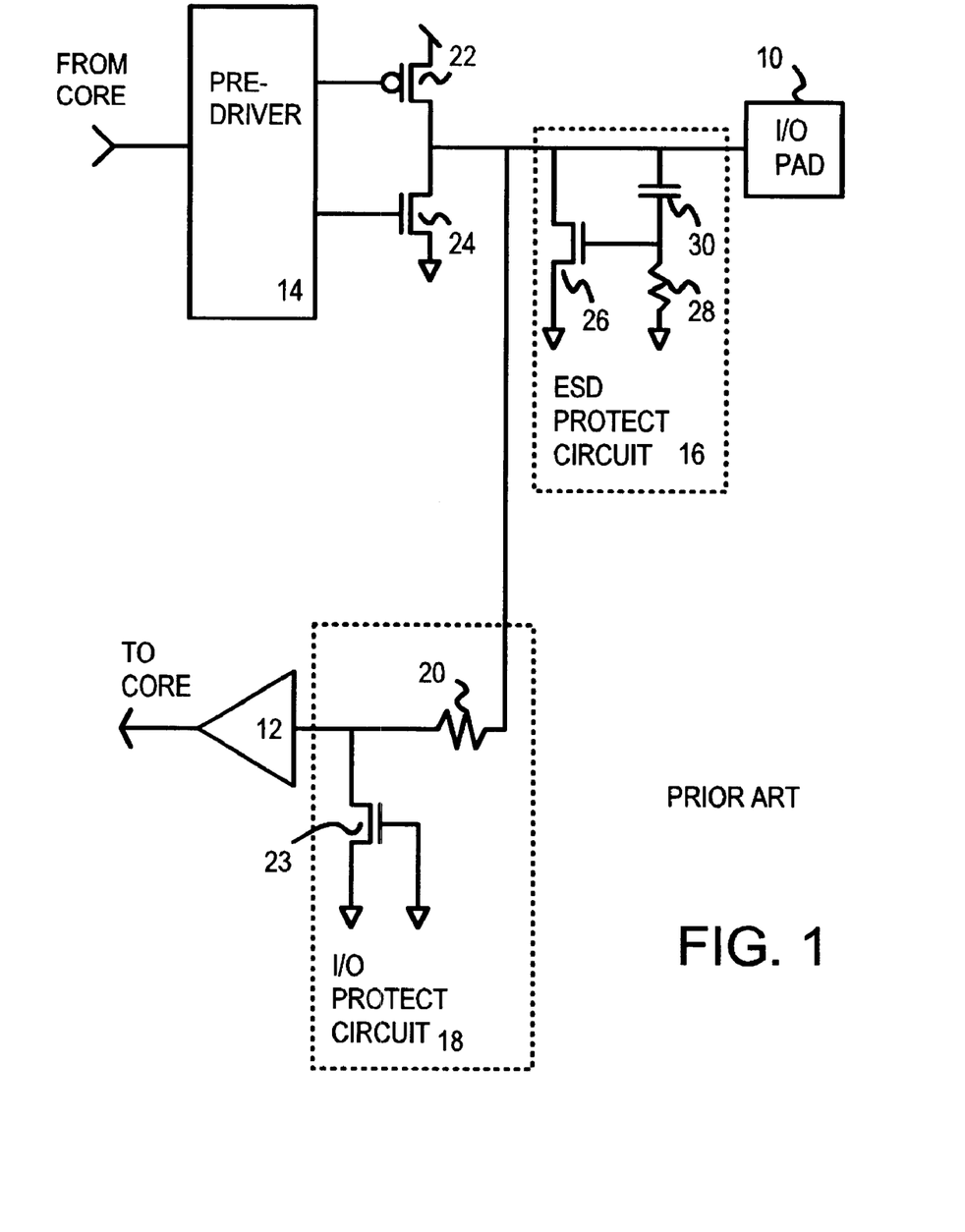
FIG. 1 is a prior-art ESD-protection circuit.

FIG. 1 is a prior-art ESD-protection circuit. Core circuitry on the IC controls pre-driver 14, which drives the gates of p-channel driver transistor 22 and n-channel driver transistor 24. Driver transistors 22, 24 have their drains connected to I/O pad 10, and drive signals off-chip.

I/O pad 10 can sometimes operate as an input rather than an output. An external signal applied to I/O pad 10 can drive internal circuitry in the core by passing through series resistor 20 and input buffer 12. I/O protection circuit 18 includes series resistor 20 and n-channel grounded-gate transistor 23. When an ESD pulse is applied to I/O pad 10, series resistor 20 can dissipate some of the energy and reduce the voltage on the input of input buffer 12. Grounded-gate transistor 23 can turn on to shunt the ESD pulse to ground, either by normal channel conduction for a negative ESD pulse, or by drain-to-source breakdown (punch-through). A thicker field-oxide may be used for the gate oxide of grounded-gate transistor 23 rather than the more damage-prone thin gate oxide.

A second protection circuit is added for further protection. ESD protection circuit 16 is placed between I/O pad 10 and series resistor 20. An R-C network is attached to the gate of n-channel ESD transistor 26. When an ESD pulse occurs, the rapid rise in voltage is coupled from I/O pad 10 to the gate of n-channel ESD transistor 26 by capacitor 30. The rise in voltage turns on n-channel ESD transistor 26, allowing it to shunt current from I/O pad 10 to ground. This can keep the voltage at the drains of driver transistors 22, 24 below their breakdown voltage, protecting them as well as protecting input buffer 12.

Resistor 28 keeps the gate of n-channel ESD transistor 26 at ground during normal operation. However, during normal operation high-speed signals may couple through capacitor 30 to the gate of n-channel ESD transistor 26, possibly even turning it on, or allowing sub-threshold conduction to occur if not fully turned on. This can degrade input signal quality and even cause false signal reception.

Capacitance is also added to the input, due to the capacitance of capacitor 30. Often large device sizes are needed for protection circuits to handle the large ESD currents. The large device sizes can increase die size and IC cost. The additional capacitance can limit higher-frequency operation. Newer, low-voltage processes can have lower threshold voltages, and thus n-channel ESD transistor 26 may more easily turn on as devices are scaled down. Such unwanted turning on of ESD transistors during normal input switching can hinder IC operation.

What is desired is an ESD-protection circuit for high-frequency and low-voltage circuits. A lower-cost, reduced-die-area ESD structure is desirable, one that has minimal additional capacitance and does not accidentally turn on during normal input switching for normal operation of the IC.

DETAILED DESCRIPTION

The present invention relates to an improvement in ESD-protection devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that the large output driver transistor can be used to shunt ESD pulses. Rather than connect an R-C network to a dedicated ESD transistor, R-C networks coupled the ESD pulse to the gates of the large output driver transistors.

Transistor switches are inserted into the R-C networks. These transistor switches disconnect the R-C networks during normal operation, and ensure that the R-C networks couple the I/O pad to the gates of the output driver transistors only when power is turned off. Since ESD events normally occur when power is disconnected, such as during handling by a person or machine, the ESD protection is only needed when power is off. Thus an active ESD-protection device can be disabled during normal powered operation of the IC.

Figure 2:
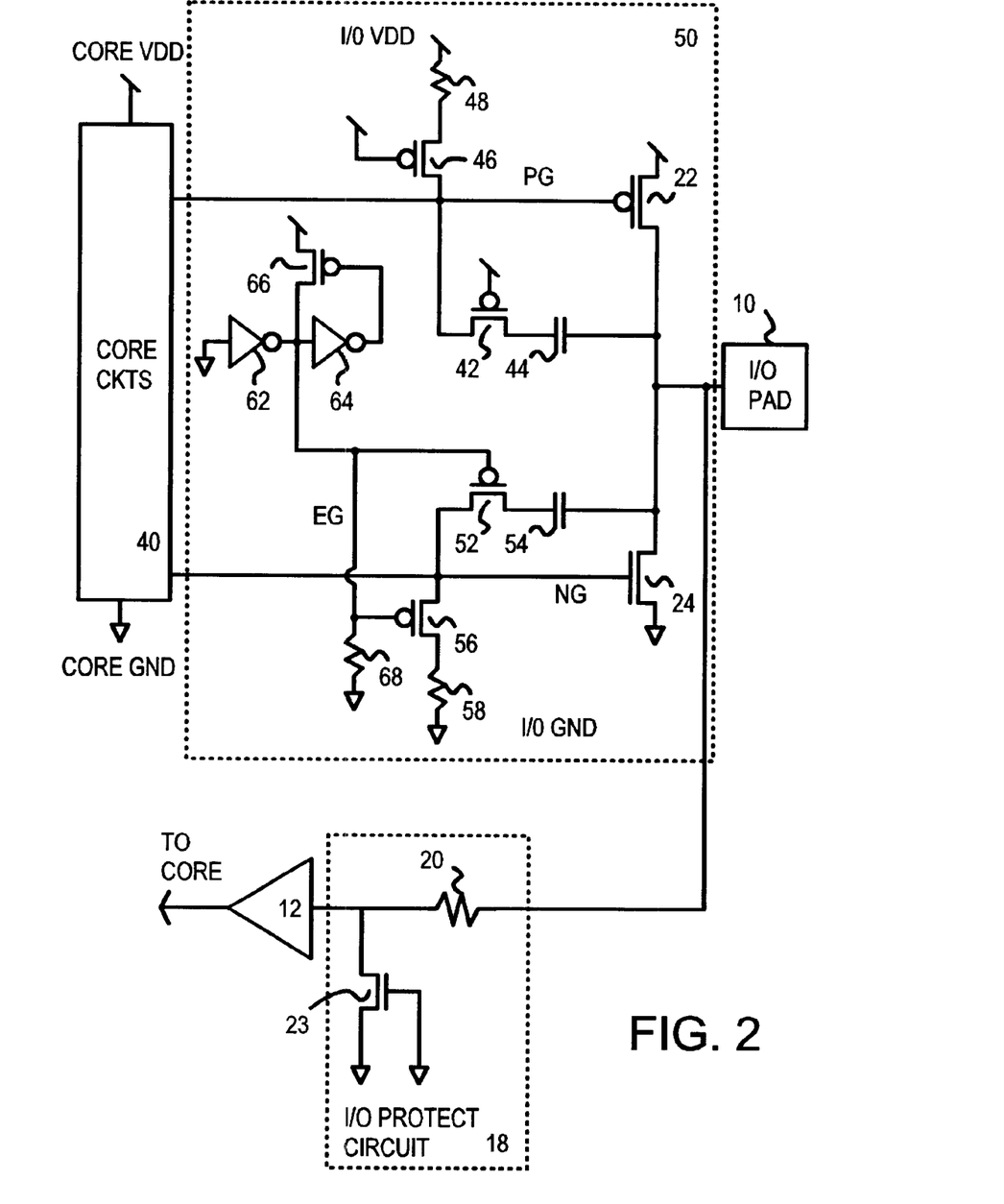
FIG. 2 shows an ESD-protection circuit that uses R-C coupling to the gates of the large output driver transistors.

FIG. 2 shows an ESD-protection circuit that uses R-C coupling to the gates of the large output driver transistors. Core circuitry 40 drives the gate node PG of p-channel driver transistor 22 and gate node NG of n-channel driver transistor 24. Driver transistors 22, 24 are large driver transistors, often having channel widths of several hundred microns but a channel length of only 1 micron. Driver transistors 22, 24 are typically able to deliver several milli-amps of current to I/O pad 10.

A standard I/O protection circuit 18 is connected between I/O pad 10 and input buffer 12. Series resistor 20 limits current to grounded-gate transistor 23, which can turn on during an ESD pulse. This additional protection is desirable but not mandatory for protecting the more delicate gates of input buffer 12. ESD protection circuit 50 can be used separately or in conjunction with I/O protection circuit 18.

ESD pulses can be coupled to gate node NG of n-channel driver transistor 24 by an R-C network formed by capacitor 54, transistors 52, 56, and resistor 58. P-channel de-coupling transistors 52, 56 are turned off during normal operation of the IC to disconnect the R-C network during normal operation. The gates of p-channel de-coupling transistors 52, 56 are driven by gate node EG, which is driven high by p-channel pullup transistor 66 during normal operation, when the power-supply Vcc voltage is active.

When power is disconnected, pull-down resistor 68 pulls gate node EG to ground, turning on p-channel de-coupling transistors 52, 56. Then a positive ESD pulse applied to I/O pad 10 is coupled across capacitor 54 through p-channel de-coupling transistor 52 to gate node NG, causing n-channel driver transistor 24 to turn on, shunting the ESD pulse from I/O pad 10 to ground.

The coupled pulse to gate node NG is discharged through p-channel de-coupling transistor 56 and resistor 58 to ground. The resistance value of resistor 58 determines how quickly the coupled pulse is discharged from node NG, and how long n-channel driver transistor 24 remains on to shunt the ESD pulse from I/O pad 10. The capacitance value of capacitor 54 determines how high the voltage of gate node NG goes during an ESD pulse. Parasitic capacitances on node NG decrease the coupling ratio and thus decrease the voltage coupled into node NG. Simulations can be used to optimize these values for a particular circuit and type of ESD pulse.

Gate node EG is driven by inverter 62, which has its input grounded. Thus inverter 62 drives node EG high when powered, but does not drive node EG when power is turned off. Inverter 64 inverts node EG to drive the gate of p-channel pull-up transistor 66, providing feedback to keep node EG high when powered. Pull-down resistor 68 discharges node EG when power is turned off, ensuring that the gates of p-channel de-coupling transistors 52, 56 are driven to ground when power is off, enabling transistors 52, 56 for ESD protection.

A second R-C network is used to couple negative ESD pulses to turn on p-channel driver transistor 22. Capacitor 44 and p-channel de-coupling transistor 42 are connected in series between I/O pad 10 and gate node PG, while p-channel de-coupling transistor 46 and resistor 48 are connected in series between gate node PG and power.

During normal IC operation when powered up, the gates of p-channel de-coupling transistors 42, 46 are driven high by Vcc. This turns p-channel de-coupling transistors 42, 46 off, disconnecting resistor 48 and capacitor 44 from gate node PG. This minimizes the added capacitance to gate node PG, improving speed.

When power is turned off, the gates of p-channel de-coupling transistors 42, 46 are connected to whatever is connected to the Vcc pad. During some ESD testing, the Vcc pad is grounded. Also, internal Vcc-to-ground ESD circuits can connect Vcc to ground when power is disabled. Thus the gates of p-channel de-coupling transistors 42, 46 can be expected to be connected to ground when power is disconnected and an ESD pulse occurs.

When a negative ESD pulse is applied to I/O pad 10, the ESD pulse is coupled across capacitor 44 through p-channel de-coupling transistor 42 to gate node PG. As gate node PG falls in voltage, p-channel driver transistor 22 develops a negative gate-to-source voltage and turns on. The ESD pulse can then be conducted through p-channel driver transistor 22 to the Vcc power-supply bus.

The negative pulse coupled to gate node PG is discharged through p-channel de-coupling transistor 46 and resistor 48 to the Vcc power-supply bus. Normally a dedicated I/O power-supply bus and a dedicated I/O ground bus are used for some or all I/O pins and driver transistors. These I/O supply and ground busses are separate from the core Vcc and ground busses that supply core circuitry 40. Often separate I/O pins are used for I/O and core supplies, especially for larger IC's.

Figure 3:
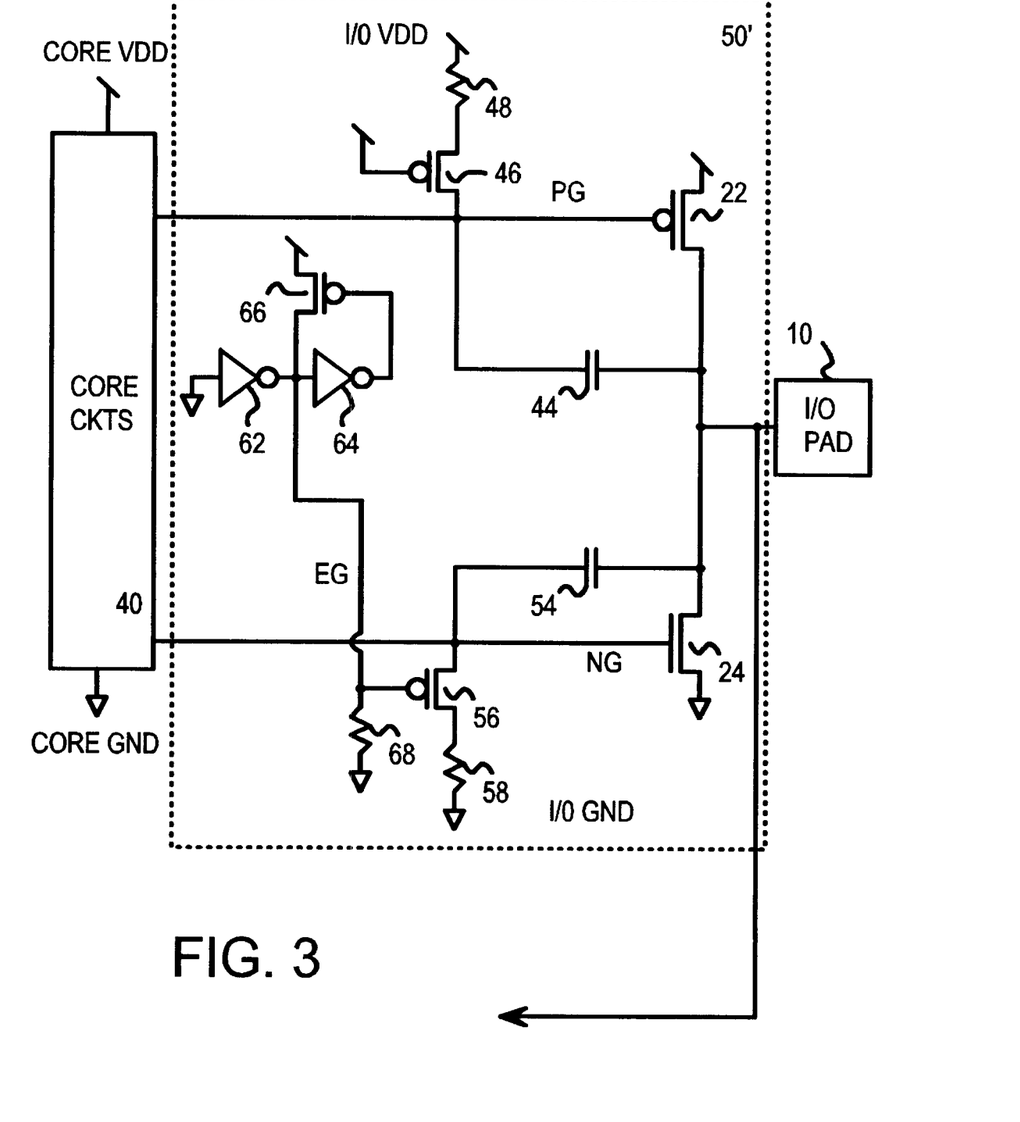
FIG. 3 is an alternate embodiment of the ESD protection circuit with R-C coupling to the gates of the large driver transistors.

FIG. 3 is an alternate embodiment of the ESD protection circuit with R-C coupling to the gates of the large driver transistors. Core circuitry 40 drives gate node PG of p-channel driver transistor 22 and gate node NG of n-channel driver transistor 24. Large driver transistors 22, 24 have drains driving I/O pad 10.

ESD protection circuit 50' directly couples capacitor 44 between I/O pad 10 and gate node PG without a p-channel de-coupling transistor. Likewise, capacitor 54 directly couples I/O pad 10 and gate node NG without an intervening de-coupling transistor. This increases capacitance on gate nodes PG, NG during normal operation, but is a simpler, cheaper circuit arrangement. ESD pulses can be more rapidly coupled to the gate nodes without the delay due to the effective resistance of the intervening p-channel de-coupling transistors.

Gate node PG is still discharged after an ESD event by pullup resistor 48 through p-channel de-coupling transistor 46. The gate of p-channel de-coupling transistor 46 is connected to power to turn it off when power is applied, but allow it to turn on when power is grounded during an ESD event.

Gate node NG is discharged to ground by resistor 58 through p-channel de-coupling transistor 56. The gate of p-channel de-coupling transistor 56 is node EG, which is driven high during normal powered operation by inverter 62 and p-channel pull-up transistor 66, which is feedback through inverter 64. When power is removed, pull-down resistor 68 pulls node EG to ground, enabling p-channel de-coupling transistor 56.

Figure 4:
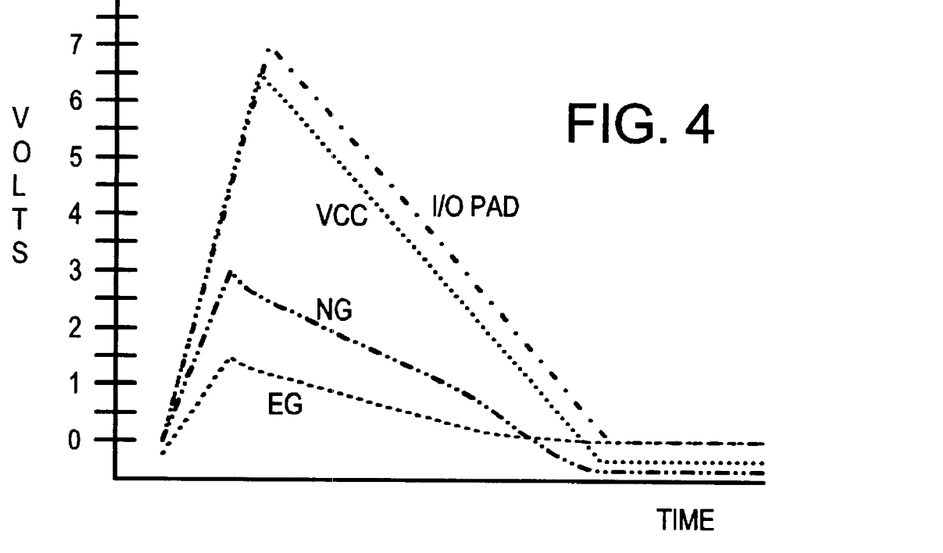
FIG. 4 is a waveform diagram of a positive ESD pulse being dissipated by coupling to the gate of the large n-channel driver transistor.

FIG. 4 is a waveform diagram of a positive ESD pulse being dissipated by coupling to the gate of the large n-channel driver transistor. The embodiment of FIG. 3 is being simulated. In this simulation, an ESD pulse of +7 volts is applied to the I/O pad, while the I/O ground is ground, and the I/O power supply is floating.

The capacitor couples a portion of the ESD pulse into gate node NG. Gate node NG rises to about 3 volts, indicating a coupling ratio of less than 50%. This gate voltage is above the transistor threshold voltage, so the large n-channel driver transistor turns on. As node NG rises above threshold, the n-channel driver transistor turns on, shunting current from the ESD pulse on the I/O pad to ground.

Node EG is also pulled up to about 1 volt, due to parasitic capacitive coupling across the gate of p-channel de-coupling transistor 56. Pull-down resistor 68 eventually discharges node EG. The I/O power supply also rises. The I/O pad is coupled to the I/O Vdd power pad by the parasitic p+ to N-well diode, and IO VDD is floating for this case, so the I/O Vdd pad tracks the I/O pad by a fixed diode drop.

When a negative ESD pulse is applied between the I/O pad and the I/O ground, the ESD pulse can be dissipated by forward biasing of a parasitic diode. The parasitic p–n junction between the n+ drain and p-type substrate (or P-well) of the large n-channel driver transistor is forward biased, since the positive ESD pulse is applied to the n+ drain, while the p-type substrate is a ground. Thus both positive and negative ESD pulses can be dissipated by the large n-channel driver transistor when the ESD pulse is applied between the I/O pad and ground.

Figure 5:
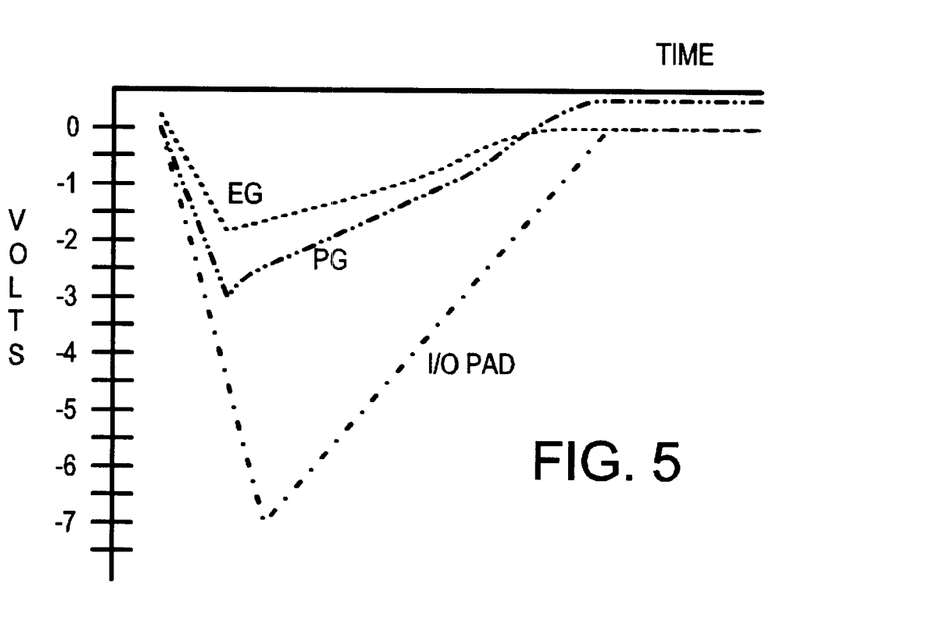
FIG. 5 is a waveform diagram of a negative ESD pulse being dissipated by coupling to the gate of the large p-channel driver transistor.

FIG. 5 is a waveform diagram of a negative ESD pulse being dissipated by coupling to the gate of the large p-channel driver transistor. The embodiment of FIG. 3 is again being simulated. In this simulation, a negative ESD pulse of −7 volts is applied to the I/O pad, while the I/O power supply is grounded. The I/O ground is floating.

The capacitor couples a portion of the low-going ESD pulse into gate node PG.

Gate node PG falls to about −3 volts. This gate voltage is more negative than the p-channel transistor threshold voltage of about −0.7 volt, so the large p-channel driver transistor turns on. As node PG falls past the threshold, the p-channel driver transistor turns on, shunting current from the ESD pulse on the I/O power-supply pad, which is grounded during this ESD test.

Node EG is also pulled down to about −2 volt, due to parasitic capacitive coupling across the gate of p-channel de-coupling transistor 56. Pull-down resistor 68 or a path through a parasitic diode of p-channel pullup transistor 66 eventually discharges node EG.

When a positive ESD pulse is applied between the I/O pad and the I/O power-supply, the ESD pulse can be dissipated by forward biasing of a parasitic diode. The parasitic p-n junction between the p+ drain and n-type substrate (or N-well) of the large p-channel driver transistor is forward biased, since the positive ESD pulse is applied to the p+ drain, while the n-type substrate is at ground. Thus both positive and negative ESD pulses can be dissipated by the large n-channel driver transistor when the ESD pulse is applied between the I/O pad and the power-supply pad.

Figure 6:
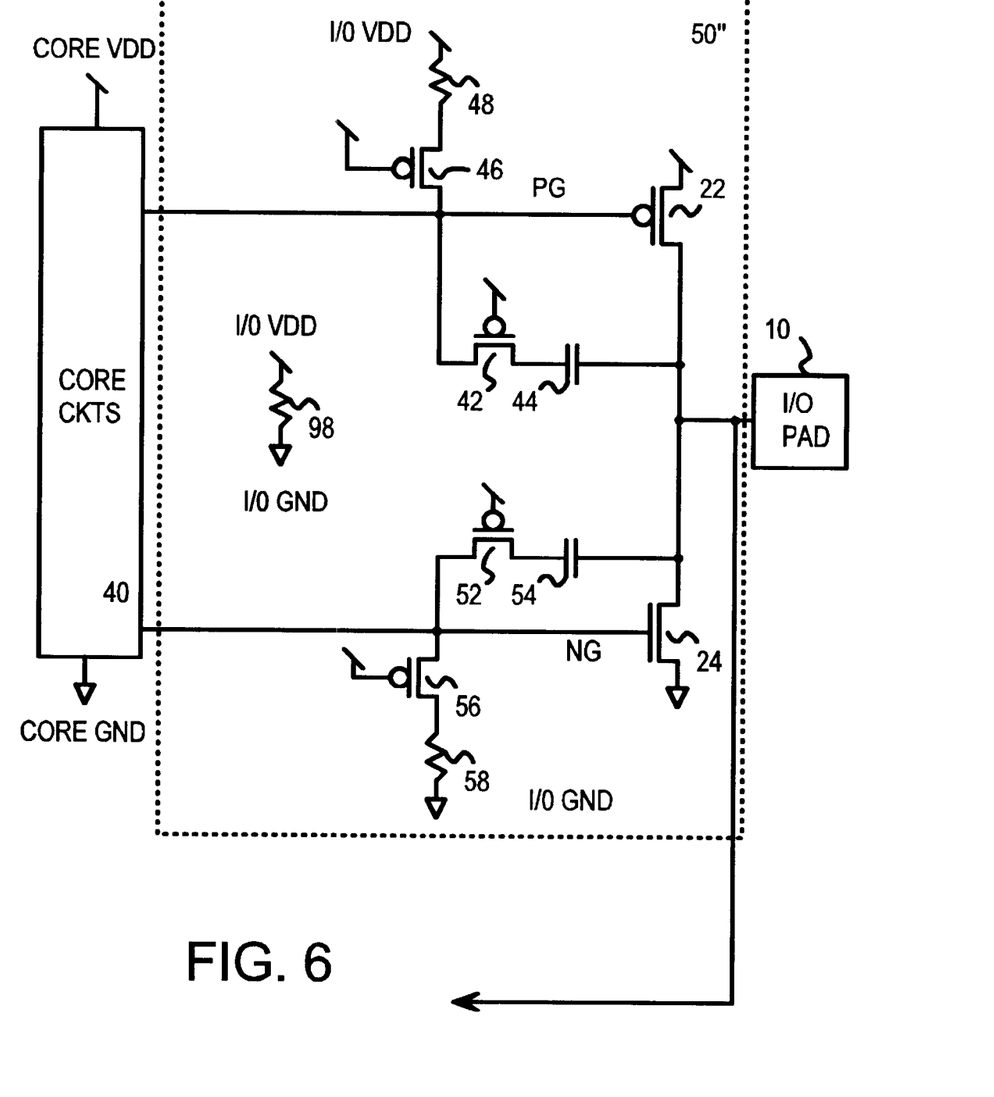
FIG. 6 is another alternate embodiment of the ESD protection circuit with R-C coupling to the gates of the large driver transistors.

FIG. 6 is another alternate embodiment of the ESD protection circuit with R-C coupling to the gates of the large driver transistors. This embodiment eliminates the feedback circuit that drove node EG. Instead, the gate of p-channel de-coupling transistor 56 is connected to power.

To ensure that the gate of p-channel de-coupling transistor 56 is pulled to ground when power is disconnected, power resistor 98 is connected between power and ground. A high resistance value is used for power resistor 98 to minimize current loss during normal powered operation. Power resistor 98 is connected between the I/O power supply and the I/O ground supply, and not the core power and ground supplies.

Core circuitry 40 drives gate node PG of p-channel driver transistor 22 and gate node NG of n-channel driver transistor 24. Large driver transistors 22, 24 have drains driving I/O pad 10.

ESD protection circuit 50'' couples capacitor 44 between I/O pad 10 and gate node PG through p-channel de-coupling transistor 42. Likewise, capacitor 54 couples I/O pad 10 and gate node NG through intervening de-coupling transistor 52.

Gate node PG is still discharged after an ESD event by pullup resistor 48 through p-channel de-coupling transistor 46. The gate of p-channel de-coupling transistor 46 is connected to power to turn it off when power is applied, but allow it to turn on when power is grounded during an ESD event.

Gate node NG is discharged to ground by resistor 58 through p-channel decoupling transistor 56. The gate of p-channel de-coupling transistor 56 is connected directly to power, so it is driven high during normal powered operation. When power is removed, power resistor 98 pulls the gate of p-channel de-coupling transistor 56 to ground, enabling p-channel de-coupling transistor 56.

ALTERNATE EMBODIMENTS

Several other embodiments are contemplated by the inventor. For example other kinds of feedback circuits can be used to bias the gates of the p-channel de-coupling transistors. The terms source and drain are interchangeable as they depend on applied voltages.

Other transistors, resistors, or capacitors could be added to the R-C network, and the order of the switch transistors can be changed or reversed. For example, an additional switch transistor could be inserted between the coupling capacitor and the I/O pad to reduce output capacitance as well as to reduce driver gate-node capacitance. The p-channel de-coupling transistors could be placed on the other sides of the resistor and/or capacitor and still block the current flow through the resistor, and de-couple the capacitor.

Just 1 coupling capacitor rather than 2 could be used to couple to the 2 p-channel de-coupling transistors. The ESD-protection circuit can be applied to dedicated outputs rather than shared input-output pins. The output can be placed in a high-impedance state by driving node PG high and node NG low. The ESD-protection device could even be used for input-only pads, such as when standard cells are used for all inputs, outputs, and bi-directional pins. The feedback circuit that drives node EG can be shared among several or all I/O driver cells.

A variety of output buffers can use the new ESD-protection structure. Instead of the simple 2-driver output buffer, more complex output buffers can be substituted. Some output buffers have several parallel pull-down driver transistors that are enabled in a controlled sequence to control the output slew rate. The R-C network could be applied to just one of these parallel driver transistors, or to several of the drivers, or to all parallel driver transistors. Some output buffers use additional weaker driver transistors. The R-C network could be applied to the weaker driver transistors or not applied to these weaker driver transistors.

The ESD-protection circuit can be combined with other input-protection circuits, such as a Vcc-to-ground ESD protection circuit, or a series-resistor protection circuit to the gate of an input buffer. Grounded-gate and thick oxide protection transistors and diodes can also be added at various points to increase ESD protection.

The large driver transistors also act as large diodes for some of the ESD tests and conditions. For example, when the ESD pulse is applied across the I/O pad and the power-supply pad, a positive ESD pulse can turn on the parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An integrated circuit (IC) with an output buffer with integrated electro-static-discharge (ESD) protection comprising:
    a pad for driving a signal from the IC to an external device;
    a p-channel driver transistor, having a p-gate node driven by core circuitry inside the IC to indicate when to drive the signal high, the p-channel driver transistor coupled to drive a pull-up current to the pad in response to the p-gate node;
    a first coupling capacitor for capacitivly coupling to the p-gate node an ESD pulse applied to the pad;
    a first resistor for discharging the ESD pulse coupled to the p-gate node by the first coupling capacitor;
    a first switch transistor, coupled to block current through the first resistor, for disconnecting current through the first resistor from the p-gate node when power is applied to the IC, but for enabling current flow through the first resistor from the p-gate node when the power is not applied to the IC;
    an n-channel driver transistor, having an n-gate node driven by the core circuitry inside the IC to indicate when to drive the signal low, the n-channel driver transistor coupled to drive a pull-down current to the pad in response to the n-gate node;
    a second coupling capacitor for capacitivly coupling to the n-gate node the ESD pulse applied to the pad;
    a second resistor for discharging the ESD pulse coupled to the n-gate node by the second coupling capacitor; and
    a second switch transistor, coupled to block current through the second resistor, for disconnecting current through the second resistor from the n-gate node when the power is applied to the IC, but for enabling current flow through the second resistor from the n-gate node when the power is not applied to the IC, whereby the ESD pulse is coupled to the gate rodes of the driver transistors when the power is not applied to the IC.

2. The IC of claim 1 wherein the first switch transistor is a p-channel transistor having a gate coupled to a power-supply bus.

3. The IC of claim 2 wherein the second switch transistor is a p-channel transistor having a gate coupled to the power-supply bus.

4. The IC of claim 3 further comprising:
    a leaker resistor, coupled between the power-supply bus and a ground on the IC, for discharging the power-supply bus to ground when the power is not applied to the IC.

5. The IC of claim 2 wherein the second switch transistor is a p-channel transistor having a gate coupled to a biased-gate node; and the IC
    further comprises:
    a biasing circuit for driving the biased-gate node with a high voltage when the power is applied to the IC, but for coupling the gate of the second switch transistor to a low voltage when the power is not applied to the IC.

6. The IC of claim 5 wherein the biasing circuit comprises:
    an inverter with an input connected to a ground and an output driving the of the biased-gate node; and
    a pull-down resistor coupled to the biased-gate node, for discharging the biased-gate node to ground when the power is not applied to the IC.

7. The IC of claim 6 wherein the biasing circuit further comprises:
    a feedback transistor for driving the biased-gate node high in response to a feedback node applied to its gate;
    a second inverter, having an input from the biased-gate node, with an output driving the feedback node.

8. The IC of claim 2 further comprising:
    a first de-coupling transistor coupled to disconnect the first coupling capacitor from the p-gate node when the power is applied to the IC, but for connecting the first coupling capacitor to the p-gate node when the power is not applied to the IC; and
    a second de-coupling transistor coupled to disconnect the second coupling capacitor from the n-gate node when the power is applied to the IC, but for connecting the second coupling capacitor to the n-gate node when the power is not applied to the IC,
    whereby the first and second coupling capacitors are de-coupled by the first and second de-coupling transistors when the power is applied to the IC.

9. The IC of claim 8 wherein the first de-coupling transistor is a p-channel transistor having a gate coupled to the power-supply bus.

10. The IC of claim 9 wherein the second de-coupling transistor is a p-channel transistor having a gate coupled to the power-supply bus.

11. The IC of claim 9 wherein the first de-coupling transistor is connected to conduct current between the p-gate node and the first coupling capacitor;
    wherein the first coupling capacitor is coupled between the first de-coupling transistor and the pad;

wherein the second de-coupling transistor is connected to conduct current between the n-gate node and the second coupling capacitor; and wherein the second coupling capacitor is coupled between the second de-coupling transistor and the pad.

12. The IC of claim 11 wherein the first resistor is coupled between the power-supply bus and the first switch transistor;

wherein the first switch transistor has a source coupled to the first resistor and a drain coupled to the p-gate node;

wherein the second resistor is coupled between a ground bus and the second switch transistor; and wherein the second switch transistor has a drain coupled to the second resistor and a source coupled to the n-gate node.

13. The IC of claim 12 wherein when the ESD pulse is applied between the pad and the power-supply bus, and the power-supply bus is grounded and the ESD pulse is negative, the p-channel driver transistor turns on to shunt the ESD pulse to the power-supply bus;

wherein when the ESD pulse is applied between the pad and the power-supply bus, and the power-supply bus is grounded and the ESD pulse is positive, a diode formed by a drain and a substrate of the p-channel driver transistor is forward biased and turns on to shunt the ESD pulse to the power-supply bus;

wherein when the ESD pulse is applied between the pad and the ground bus, and the ground bus is grounded and the ESD pulse is positive, the n-channel driver transistor turns on to shunt the ESD pulse to the ground bus; and wherein when the ESD pulse is applied between the pad and the ground bus, and the ground bus is grounded and the ESD pulse is negative, a diode formed by a drain and a substrate of the n-channel driver transistor is forward biased and turns on to shunt the ESD pulse to the ground bus, whereby the p-channel driver transistor shunts current the ESD pulses to the power-supply bus, while the n-channel driver transistor shunts current for the ESD pulse to the ground bus.

14. An electro-static-discharge (ESD) protection circuit comprising:

a pad for connecting to an external system;

a p-channel driver transistor having a first gate coupled to a first gate node, a source connected to a power-supply bus, and a drain coupled to the pad;

a first capacitor coupled between the pad and a first coupling node; a first de-coupling transistor coupled between the first coupling node and the first gate node;

a first resistor coupled between the power-supply bus and a first discharge node;

a first discharge transistor coupled between the first discharge node and the first gate node;

an n-channel driver transistor having a second gate coupled to a second gate node, a source connected to a ground bus, and a drain coupled to the pad;

a second capacitor coupled between the pad and a second coupling node;

a second de-coupling transistor coupled between the second coupling node and the second gate node;

a second resistor coupled between the ground bus and a second discharge node; and a second discharge transistor coupled between the second discharge node and the second gate node.

15. The ESD protection circuit of claim 14 wherein the first de-coupling transistor and the first discharge transistor are p-channel transistors having gates coupled to the power-supply bus.

16. The ESD protection circuit of claim 15 wherein the second de-coupling transistor and the second discharge transistor are p-channel transistors having gates coupled to the power-supply bus.

17. The ESD protection circuit of claim 16 wherein the second de-coupling transistor and the second discharge transistor are p-channel transistors having gates coupled to a biasing node; and these protection circuit further comprises:

a biasing circuit for driving the biasing node to a power-supply voltage when a power-supply voltage is applied to the power-supply bus, but for driving the biasing node to a ground voltage when the power-supply voltage is not applied to the power-supply bus.

18. The ESD protection circuit of claim 17 wherein the biasing circuit comprises:

an inverter having an output that drives the biasing node high when the power-supply voltage is applied; and a leaker transistor coupled between the biasing node and the ground bus, for driving the biasing node to ground when the power-supply voltage is not applied.

19. An electro-static-discharge (ESD) protected output buffer comprising:

an output node;

pullup driver transistor means for sourcing a rising driving current from a first bus to the output node in response to a first gate node;

coupling capacitor means for coupling an ESD pulse applied to the output node to a coupled node;

first de-coupling transistor means for connecting the coupled node to the first gate node when power is not applied, but for disconnecting the coupled node from the first gate node when the power is applied;

first discharge means for discharging the first gate node to the first bus when the power is not applied, but for not discharging the first gate node when the power is applied;

pull-down driver transistor means for sinking a falling driving current from the output node to a second bus in response to a second gate node;

second de-coupling transistor means for connecting the coupled node to the second gate node when the power is not applied, but for disconnecting the coupled node from the second gate node when the power is applied; and second discharge means for discharging the second gate node to the second bus when the power is not applied, but for not discharging the second gate node when the power is applied, whereby the ESD pulse applied to the output node is coupled to the first or second gate node to enable the pullup or pull-down driver transistor means to shunt the ESD pulse when the power is not applied.

20. The ESD protected output buffer of claim 19 wherein the pullup driver transistor means is a p-channel transistor;

the pull-down driver transistor means is an n-channel transistor;

the first de-coupling transistor means is a p-channel transistor with a gate coupled to the first bus;

the second de-coupling transistor means is a p-channel transistor with a gate coupled to the first bus;

the first bus is a power-supply bus;

the first discharge means comprises a first resistor coupled to the first bus and a first discharge transistor between the first gate node and the first resistor with a gate coupled to the first bus; and the second discharge means comprises a second resistor coupled to the second bus and a second discharge transistor between the second gate node and the second resistor.

\* \* \* \* \*